United States Patent
Itoh et al.

(10) Patent No.: US 10,601,522 B2
(45) Date of Patent: Mar. 24, 2020

(54) OPTICAL RECEIVER

(71) Applicant: Nippon Telegraph and Telephone Corporation, Tokyo (JP)

(72) Inventors: Toshihiro Itoh, Atsugi (JP); Yuriko Kawamura, Atsugi (JP); Kiyofumi Kikuchi, Atsugi (JP); Ken Tsuzuki, Atsugi (JP); Hiroshi Fukuda, Atsugi (JP); Shin Kamei, Atsugi (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/309,410

(22) PCT Filed: Jun. 19, 2017

(86) PCT No.: PCT/JP2017/022503
§ 371 (c)(1),
(2) Date: Dec. 12, 2018

(87) PCT Pub. No.: WO2017/221880
PCT Pub. Date: Dec. 28, 2017

(65) Prior Publication Data
US 2019/0181961 A1    Jun. 13, 2019

(30) Foreign Application Priority Data
Jun. 20, 2016    (JP) .................................. 2016-121992

(51) Int. Cl.
*H04B 10/61*  (2013.01)
*H04B 10/69*  (2013.01)
*H01L 31/02*  (2006.01)

(52) U.S. Cl.
CPC .......... *H04B 10/616* (2013.01); *H01L 31/02* (2013.01); *H04B 10/61* (2013.01); *H04B 10/69* (2013.01)

(58) Field of Classification Search
CPC ........................................... H04B 10/60–6973
(Continued)

(56) References Cited

U.S. PATENT DOCUMENTS

2003/0193704 A1* 10/2003 Miremadi .............. H04B 10/69
398/202
2011/0085800 A1* 4/2011 Cerisola ........... H04B 10/07955
398/38
(Continued)

FOREIGN PATENT DOCUMENTS

JP    2015-56704 A    3/2015
JP    2016-025513 A   2/2016
(Continued)

OTHER PUBLICATIONS

International Search Report dated Aug. 29, 2017, issued in PCT Application No. PCT/JP2017/022503, filed Jun. 19, 2017.
(Continued)

*Primary Examiner* — Li Liu
(74) *Attorney, Agent, or Firm* — Workman Nydegger

(57) ABSTRACT

An optical receiver is configured so as to be as less susceptible to noise as possible even in the case where high noise occurs inside an optical transceiver. The optical receiver includes a connection part that connects two photodiodes (PDs) constituting a dual photodiode and a transimpedance amplifier (TIA), wherein signal lines from the dual photodiode are surrounded by a conductor pattern that is not connected to each of the signal lines for each channel, and the conductor pattern is connected to a ground pattern on the transimpedance amplifier or a power source pattern for the PDs.

4 Claims, 12 Drawing Sheets

(58) Field of Classification Search
USPC .................................................. 398/202–214
See application file for complete search history.

(56) References Cited

U.S. PATENT DOCUMENTS

2015/0069220 A1* 3/2015 Yagisawa .................. H03F 3/08
                                                    250/214 A
2018/0198483 A1* 7/2018 Kikuchi .................. H01S 5/022

FOREIGN PATENT DOCUMENTS

| JP | 2016018799 A | | 2/2016 | |
|---|---|---|---|---|
| JP | 2016025513 | * | 2/2016 | ............. H04B 10/61 |
| JP | 2017034184 A | | 2/2017 | |

OTHER PUBLICATIONS

International Preliminary Report on Patentability dated Jan. 3, 2019, issued in PCT Application No. PCT/JP2017/022503, filed Jun. 19, 2017.
Optical Internetworking Forum (OIF), *Implementation Agreement for Integrated Dual Polarization Intradyne Coherent Receivers*, IA # OIF-DPC-RX-01.2, Nov. 14, 2013, pp. 25.
Japanese Office Action issued in JP Patent Application No. JP 2018-524076, dated May 7, 2019.

* cited by examiner

OPTICAL RECEIVER

TECHNICAL FIELD

The present invention relates to an optical receiver used for an optical communication network.

BACKGROUND ART

Recently, services such as an SNS including sharing images and videos and a VOD whose prices are continuously decreasing as well as a portable information terminal and an STB which support the services are in widespread use. In order to ensure sufficient communication capability for these services and terminals, a demand for widening transmission capability of the optical communication network for supporting the internet has been increasing.

Among the optical communication network, short- and medium-range optical networks that make transmission between cities and the like in relatively short distances are used for transmission within a data center, and therefore, the demand for widening capability is extremely high. A digital coherent optical communication system of a wide dynamic range had been mainly introduced as optical communication of an ultralong distance due to the system's high dispersion resistance, broad dynamic range, and the like. However, along with downsizing of optical components and reduction of prices, application of the system in a shorter distance has been recently examined. Particularly, since the use of silicon photonics technique enables significant downsizing and integration of optical transmitters and optical receivers, the system is expected to considerably contribute to the cost reduction of the optical components in such a relatively closer distance.

Conventionally, as a digital coherent optical receiver used for this digital coherent optical communication system, an optical receiver shown in FIG. 1 as specified in OIF (Optical Internetworking Forum) has been used. FIG. 1 is an extract from FIG. 1 of the following Non Patent Literature 1.

CITATION LIST

Non Patent Literature

NPL: "Implementation Agreement for Integrated Dual Polarization Intradyne Coherent Receivers", Optical Internetworking Forum, IA # OIF-DPC-RX-01.2, Nov. 14, 2013, http://www.oiforum.com/public/documents/OIF_DPC_RX-01.2.pdf

SUMMARY OF INVENTION

Technical Problem

The conventional optical receiver of FIG. 1 performs, in a dual polarization optical hybrid composed of two hybrid mixers adapted to X-polarization (X-Pol) and Y-polarization (Y-Pol), optical demodulation by mixing received signal light (SIGNAL) with reference light from a light source (LOCAL OSCILLATOR). The output of optical demodulation becomes four demodulated lights for I and Q in each of the X-polarization and Y-polarization, and further converted into four pairs of electric signals due to four pairs of, or eight dual photodiodes (PDs) which are used by proximately arranging two photodiodes as a pair. These four pairs of demodulated electric signals of the PD output are inputted into transimpedance amplifiers (TIAs) for four channels for making amplification.

These elements are integrated into one package to configure an optical receiver. Here, since the PD and the TIA are to be configured on different semiconductor substrates, they are normally configured on different chips. Accordingly, there is a need to connect both chips of the PD and TIA with an electric signal line. Further, power source for the eight photodiodes (PDs) on the PD chip is independently supplied from the outside of the receiver.

A block diagram of FIG. 2 shows an entire configuration of a typical digital coherent optical transceiver in which an optical transmitter is added to this optical receiver.

In the conventional example of FIG. 2, a digital coherent optical transceiver 1 is composed of an optical receiver 2 and an optical transmitter 3. An input optical signal inputted to the optical receiver 2 is converted into electric signals by four channels of dual photodiodes (PDs) 5 via a dual polarization optical hybrid 4, which are then amplified by four channels of transimpedance amplifiers (TIAs) 6 and are outputted as input electric signals.

Output electric signals inputted to the optical transmitter 3 are electrically amplified by four channels of drivers 7 to modulate CW light in four channels of optical modulators 8, thereby resulting in an output optical signal.

FIG. 3 shows a configuration of the entire four channels including a connection part (PD-TIA connection part) between the photodiodes (PDs, PD chip) 5 and the transimpedance amplifier (TIA, TIA chip) 6 in this conventional optical receiver 2. Although FIG. 3 shows only one channel of the circuit overview, other channels have the same circuit configuration.

FIG. 4 shows a detailed circuit diagram of the PD-TIA connection part of FIG. 3 for one channel.

In FIG. 4, inputted signal light is converted into one set of dual-system electric signals by the two PDs (PD1, PD2) constituting the dual photodiode on the PD chip 5, which are connected to the transimpedance amplifier (TIA) chip 6 by a pair of, or two signal lines IN, INC. In FIG. 4, symbols for the TIA amplifier itself are not illustrated.

In the conventional optical receiver of FIG. 4, two PD power sources (VPD1, VPD2) for the dual photodiode are directly connected to the respective PDs from outside of the PD chip 5, and capacitors (C51, C52) are located on the PD chip 5.

However, as downsizing progresses, it is remarkably effective for the downsizing to supply the power for the photodiode from the TIA chip 6 side, and further to integrate the capacitors and the like for the power source of the photodiode into the TIA chip 6.

As the conventional technique of such downsizing, a configuration shown in FIG. 5 is known for a typical non-coherent optical receiver. In the conventional technique of FIG. 5, the power of the photodiode (PD) 5 that does not have a dual configuration is supplied from the transimpedance amplifier (TIA) 6 side.

Forms that simply extend this type of configuration to the dual photodiode used in the coherent optical receiver are those of conventional techniques shown in FIG. 6, FIG. 7, and FIG. 8.

FIG. 6 is a block diagram representing the entire four channels including the PD-TIA connection part in this conventional technique. FIG. 7 is a circuit diagram of the PD-TIA connection part for one channel in the case where two PD's power sources are independent (VPD1, VPD2) in supplying the PD power from the TIA chip 6. FIG. 8 is a circuit diagram of the PD-TIA connection part for one channel in the case where two PD's power sources are shared (VPD).

However, all the forms of such conventional techniques have no portion to electromagnetically protect the signal lines IN, INC of the PD-TIA connection part and their terminals. Particularly, the PD output electric signal is weak before amplification in a TIA input side, and thus is susceptible to an electromagnetic field from the outside, thereby being affected by other reception channels.

Further, in the case of enhancing integration and downsizing to implement an extreme transceiver-integrated chip by using the silicon photonics technique, a transmitter and receiver cannot be completely separated, and a distance therebetween is also close to each other, whereby the influence of electromagnetic waves emitted by the transmitter exerted on the receiver cannot be disregarded.

As such, in the conventional technique, the electric signal lines and terminals within the optical receiver are directly affected by the electromagnetic field in the external environment, thereby inducing deterioration of reception sensitivity and deterioration of amplification noise resistance.

An object of the present invention is to configure an optical receiver as less susceptible to noise as possible, even if built in the same enclosure with an optical transmitter where high electrical noise occurs.

Solution to Problem

For achieving such an object, the present invention includes the following configurations.
(Configuration 1 of the Invention)
An optical receiver including: a PD chip on which two photodiodes (PDs) constituting a dual photodiode are mounted for each channel; and a TIA chip on which a transimpedance amplifier (TIA) corresponding to each channel is mounted, wherein a signal line connecting the PD chip and the TIA chip is surrounded by a conductor pattern that is not connected to the signal line for each channel, the conductor pattern being connected to a ground pattern on the TIA chip or a power source pattern for the PDs.
(Configuration 2 of the Invention)
The optical receiver according to Configuration 1 of the invention, wherein the conductor pattern includes two independent conductor patterns that correspond to the respective two PDs for each channel, the conductor patterns being independently connected to the TIA chip and each being capacitively coupled to a ground pattern within the TIA chip.
(Configuration 3 of the Invention)
The optical receiver according to Configuration 1 of the invention, wherein:
the two PDs constituting the dual photodiode are connected with their cathodes facing each other, a connecting point of the cathodes being connected to a PD power source pattern on the TIA chip;
from two anodes of the two PDs, two signal lines are drawn out and are inputted into the TIA chip;
from the cathode connecting point, the conductor pattern is branched so as to surround the two PDs toward circumferential sides of the PD chip, and the branched patterns are drawn out as two PD power source patterns from positions sandwiching the two signal lines and are connected to the PD power source pattern on the TIA chip; and
the PD power source pattern on the TIA chip is grounded at a high frequency with a capacitor on the TIA chip.

(Configuration 4 of the Invention)
The optical receiver according to Configuration 1 of the invention, wherein:
the two PDs constituting the dual photodiode are connected with their cathodes facing each other, a connecting point of the cathodes being connected to a PD power source pattern on the TIA chip;
from two anodes of the two PDs, two signal lines are drawn out and are inputted into the TIA chip;
from the cathode connecting point, the conductor pattern is branched so as to surround the two PDs toward circumferential sides of the PD chip via a capacitor, and the branched patterns are drawn out as two ground patterns from positions sandwiching the two signal lines and are connected to ground patterns on the TIA chip; and
the PD power source pattern on the TIA chip is grounded at a high frequency with a capacitor on the TIA chip.
(Configuration 5 of the Invention)
The optical receiver according to Configuration 1 of the invention, wherein:
the two PDs constituting the dual photodiode are arranged with their anodes facing each other, and two signal lines are drawn out from both the anodes and are inputted into the TIA chip;
the conductor pattern is connected to cathodes of the two PDs on circumferential sides of the PD chip, which are branched on the respective circumferential sides, are drawn out from positions sandwiching the terminals of the two signal lines, and are connected to the PD power source pattern on the TIA chip; and
the PD power source pattern on the TIA chip is grounded at a high frequency with a capacitor on the TIA chip.
(Configuration 6 of the Invention)
The optical receiver according to Configuration 2 of the invention, wherein:
the two PDs constituting the dual photodiode are arranged with their anodes facing each other, and two signal lines are drawn out from both the anodes and are inputted into the TIA chip;
the conductor pattern is connected to cathodes of the two PDs on circumferential sides of the PD chip in an alternating-current mode via a capacitor, which are branched on the respective circumferential sides, are drawn out from positions sandwiching the two signal lines, and are respectively connected to two PD power source patterns on the TIA chip; and
the two PD power source patterns on the TIA chip are respectively grounded at high frequencies with two capacitors on the TIA chip.

Advantageous Effects of Invention

As described above, according to the present invention, in an optical receiver built in the same enclosure with an optical transmitter, it is possible to configure the optical receiver as less susceptible to noise as possible, even if high noise occurs inside.

DESCRIPTION OF EMBODIMENTS

With reference to the drawings, embodiments of the present invention will be explained below in detail.

First Embodiment

Figure 1:
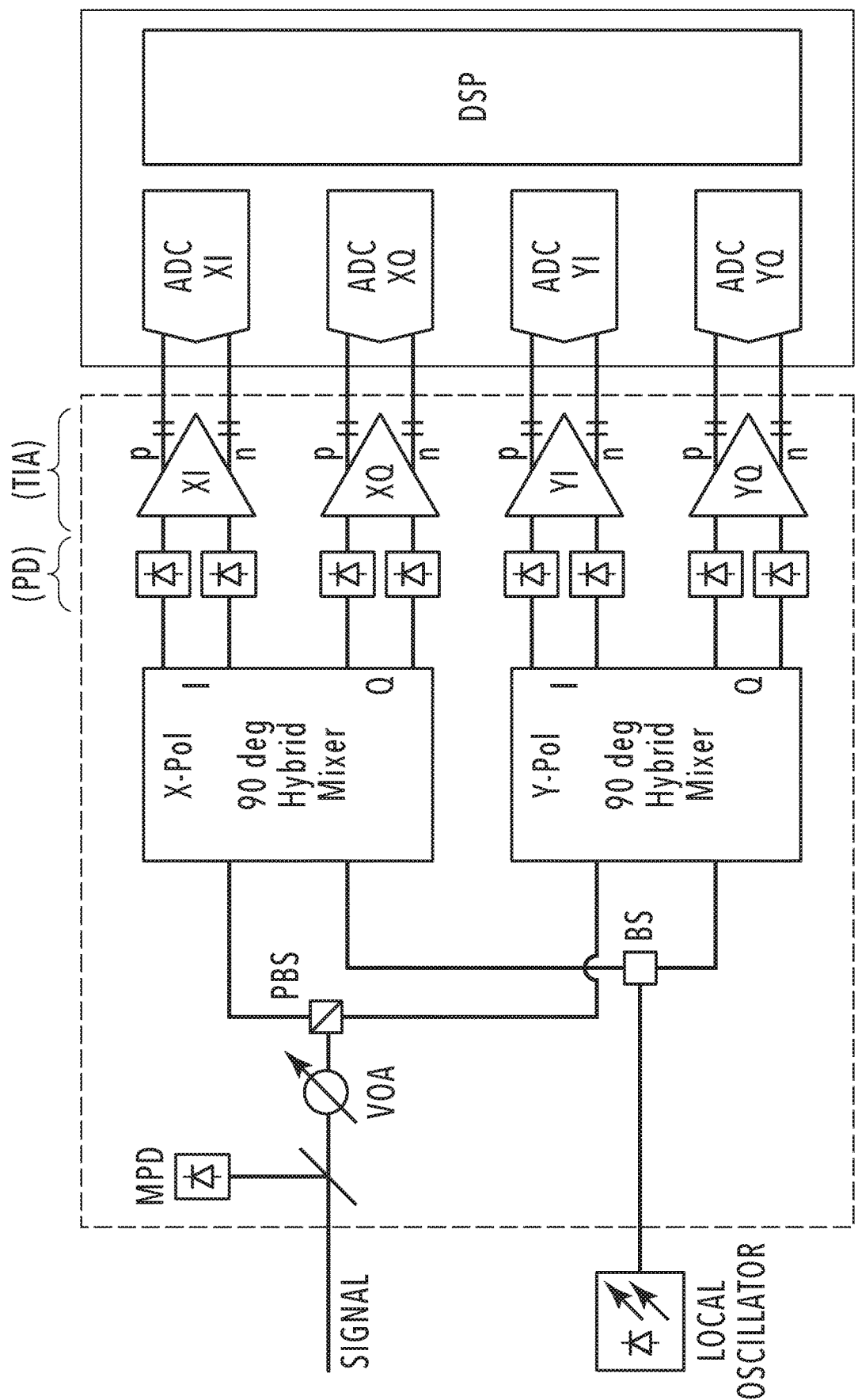
FIG. 1 is a diagram showing one example of a conventional digital coherent optical receiver.
Figure 2:
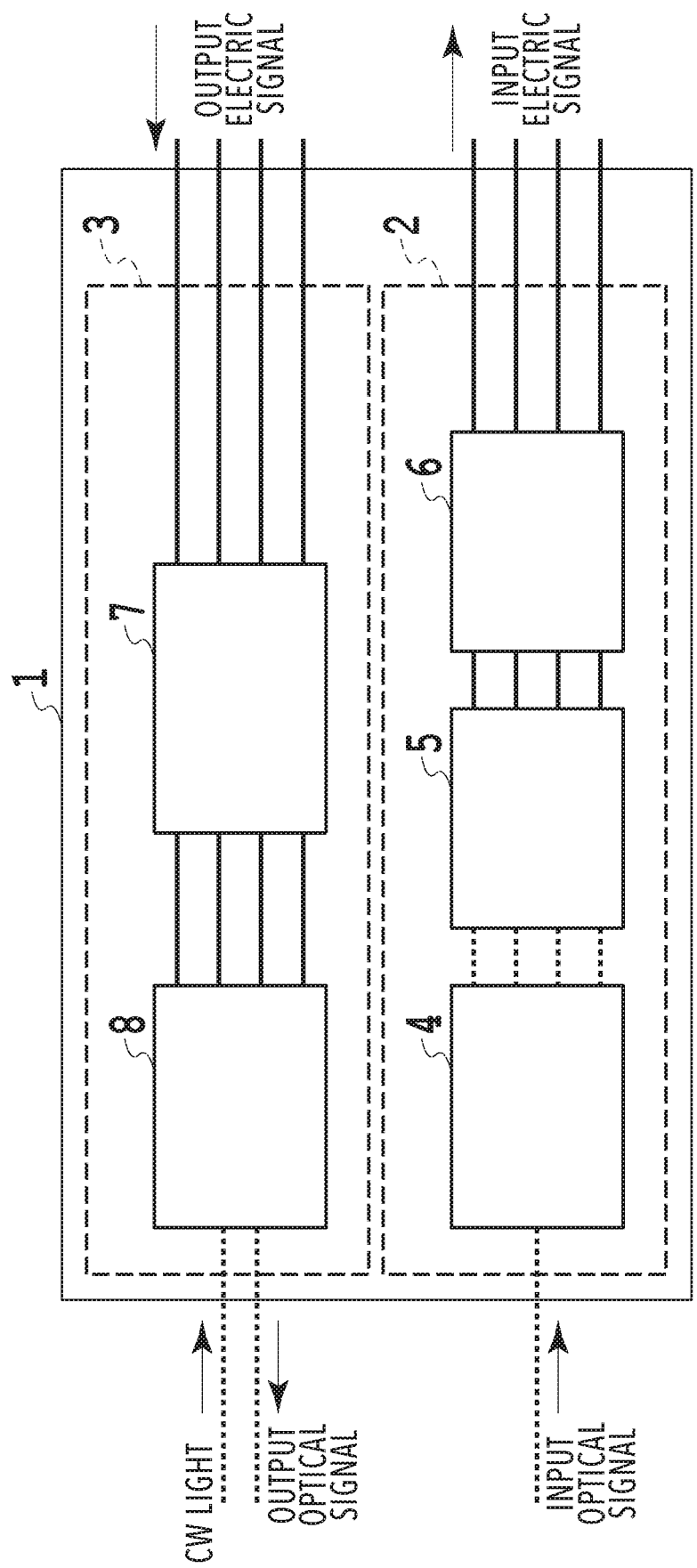
FIG. 2 is a block diagram of an entire conventional digital coherent optical transceiver.
Figure 3:
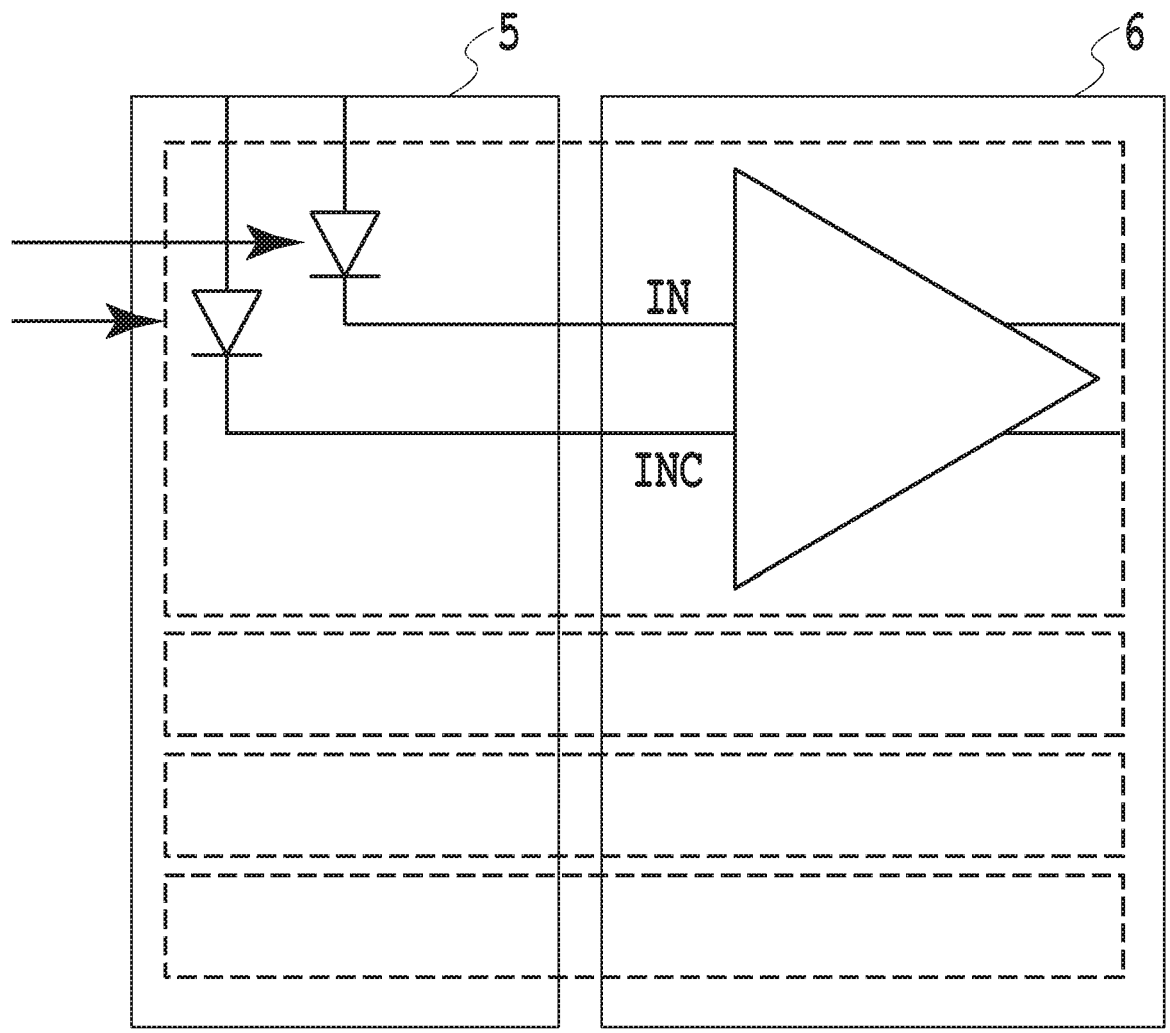
FIG. 3 is a block diagram representing a photodiode-transimpedance amplifier (PD-TIA) connection part of the conventional digital coherent optical receiver for entire four channels.
Figure 4:
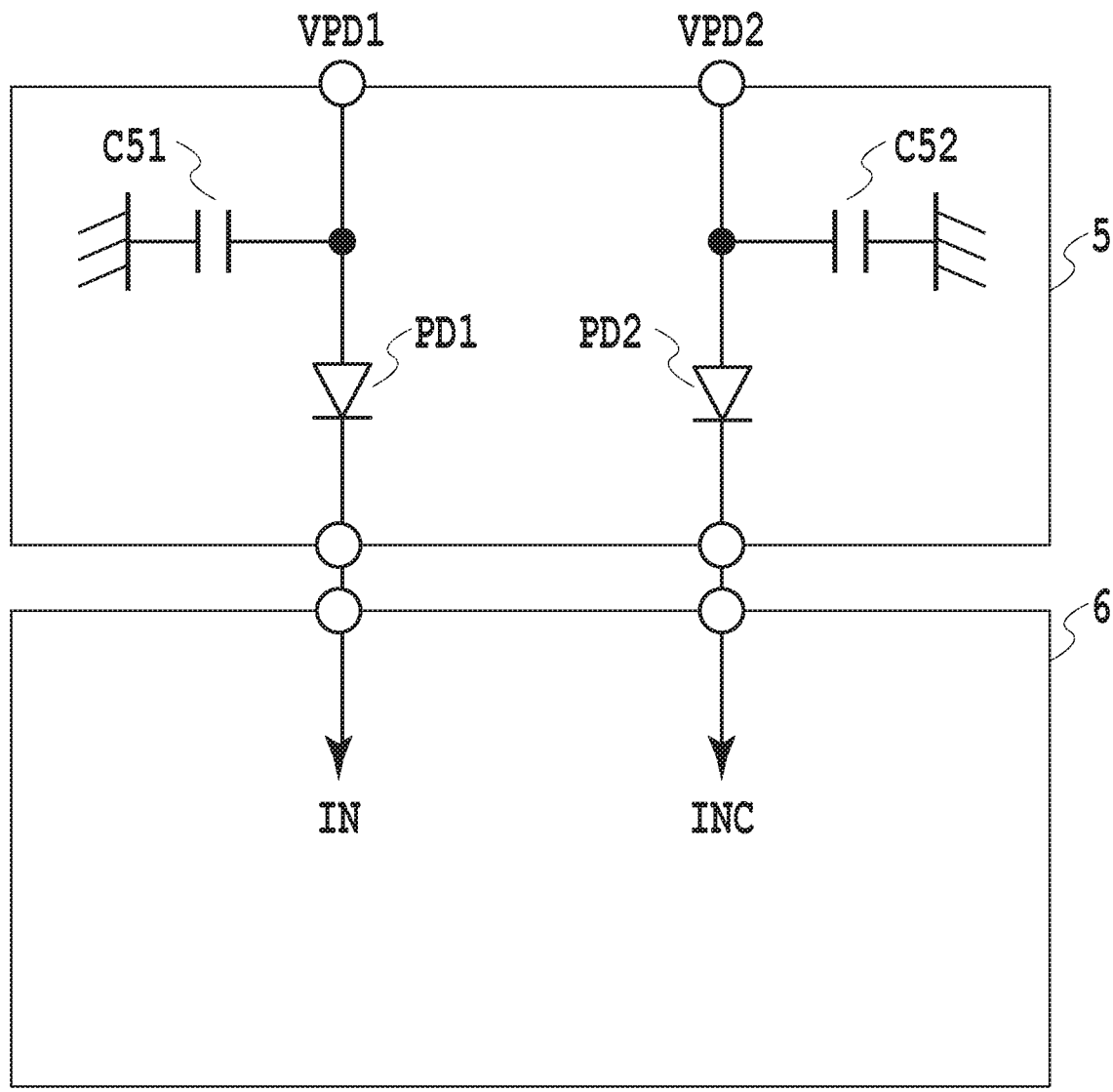
FIG. 4 is a detailed circuit diagram of the PD-TIA connection part of FIG. 3 for one channel.
Figure 5:
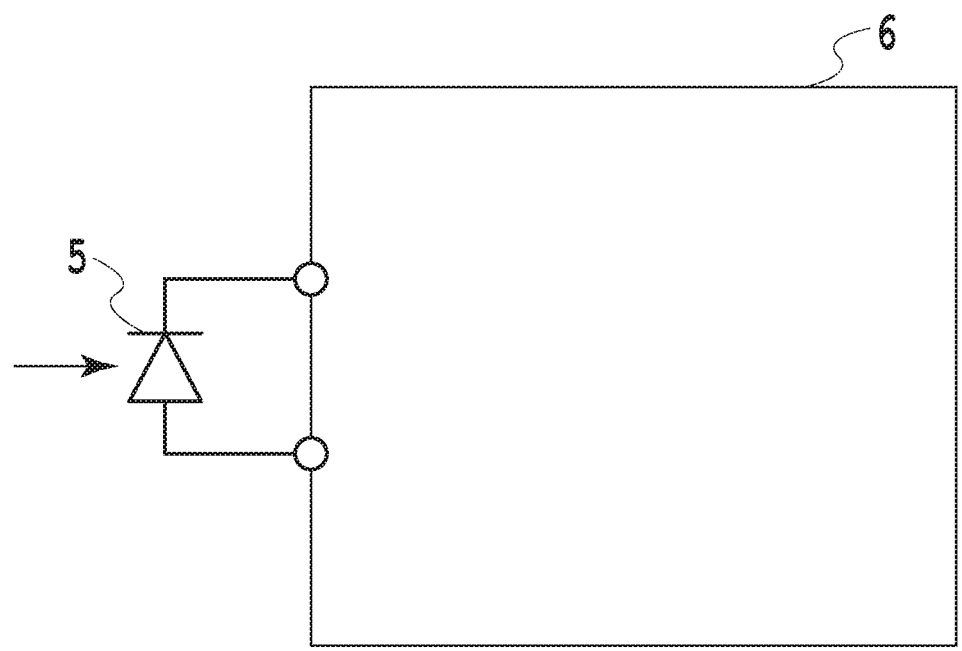
FIG. 5 is a schematic diagram of the PD-TIA connection part when a PD power is supplied from TIA according to the conventional technique.
Figure 6:
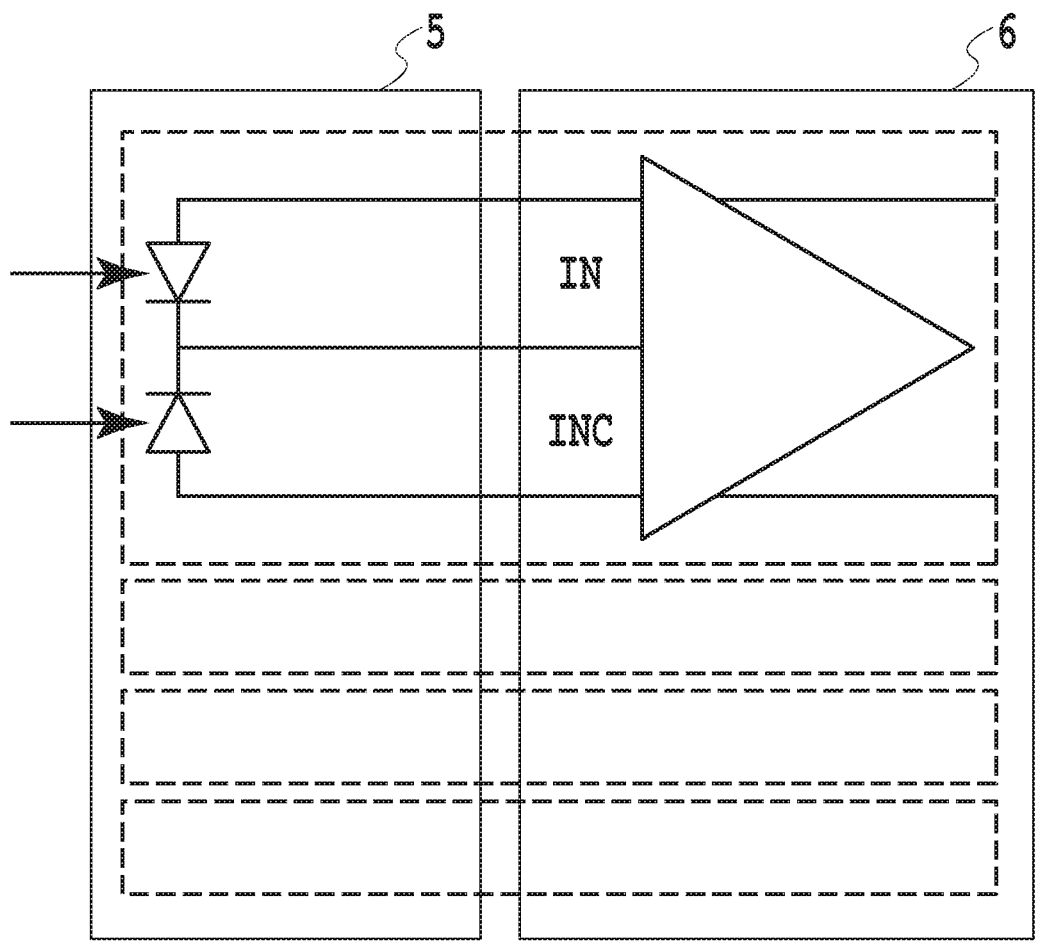
FIG. 6 is a block diagram representing the PD-TIA connection part of the coherent optical receiver for entire four channels when the PD power is supplied from the TIA in the conventional technique.
Figure 7:
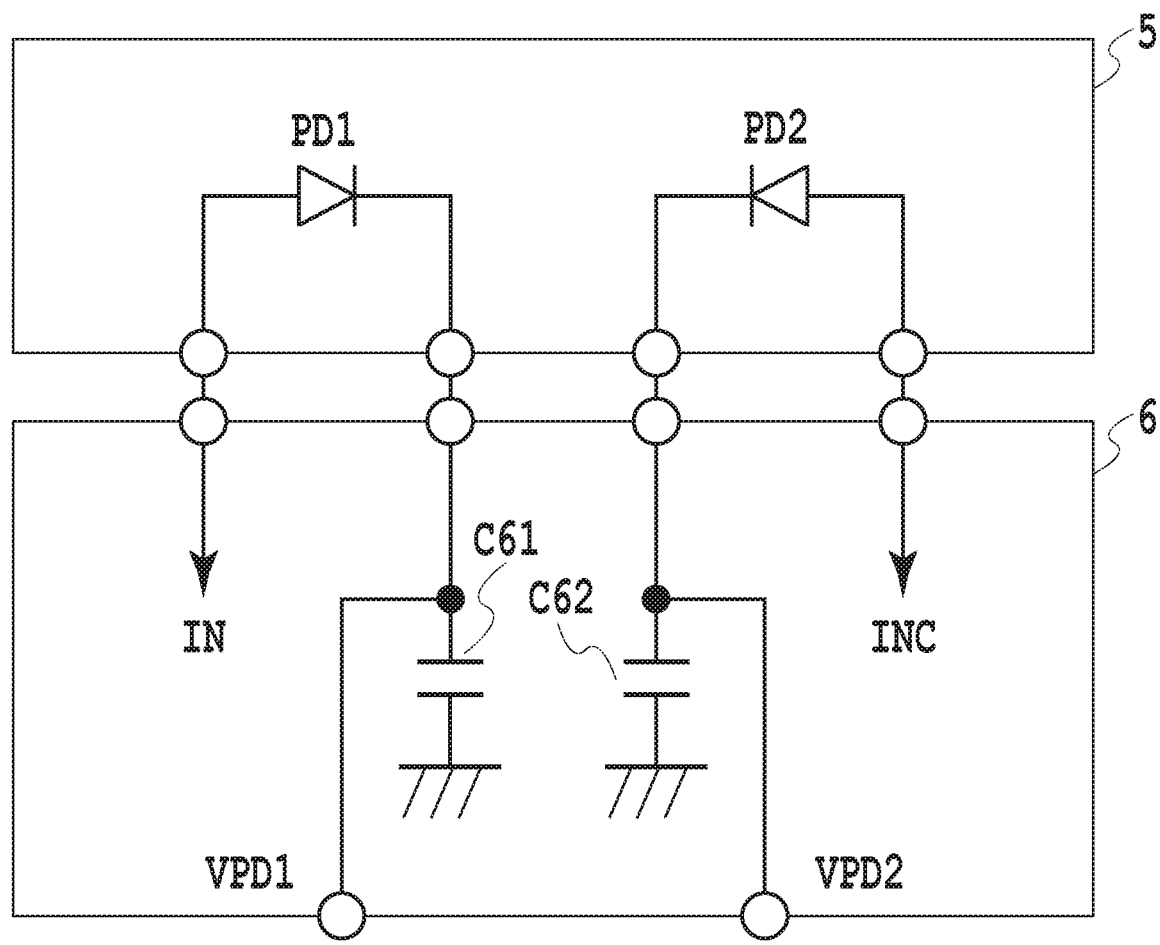
FIG. 7 is a circuit diagram of the PD-TIA connection part for one channel when two PD's power sources are independent in supplying the PD power from the TIA in the conventional technique.
Figure 8:
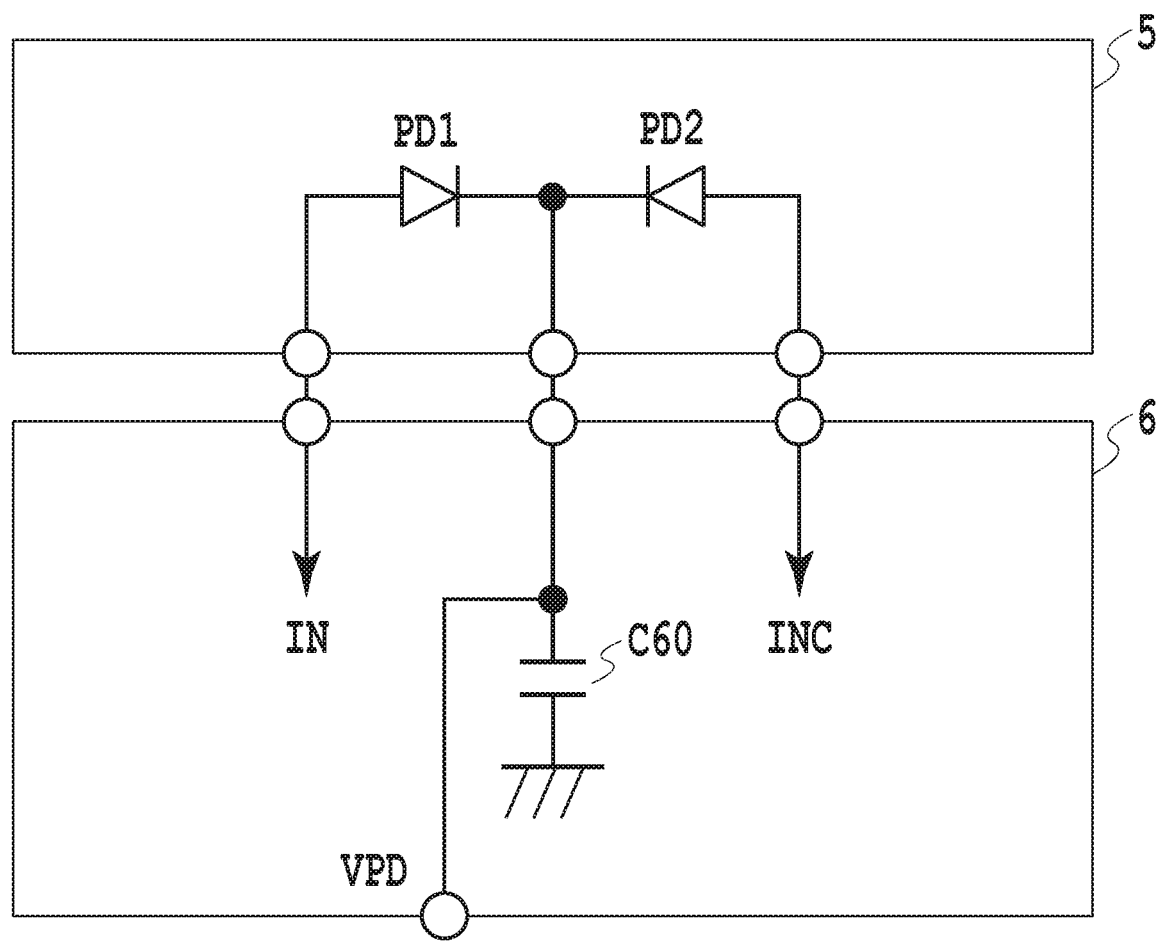
FIG. 8 is a circuit diagram of the PD-TIA connection part for one channel when two PD's power sources are shared in supplying the PD power from the TIA in the conventional technique.
Figure 9:
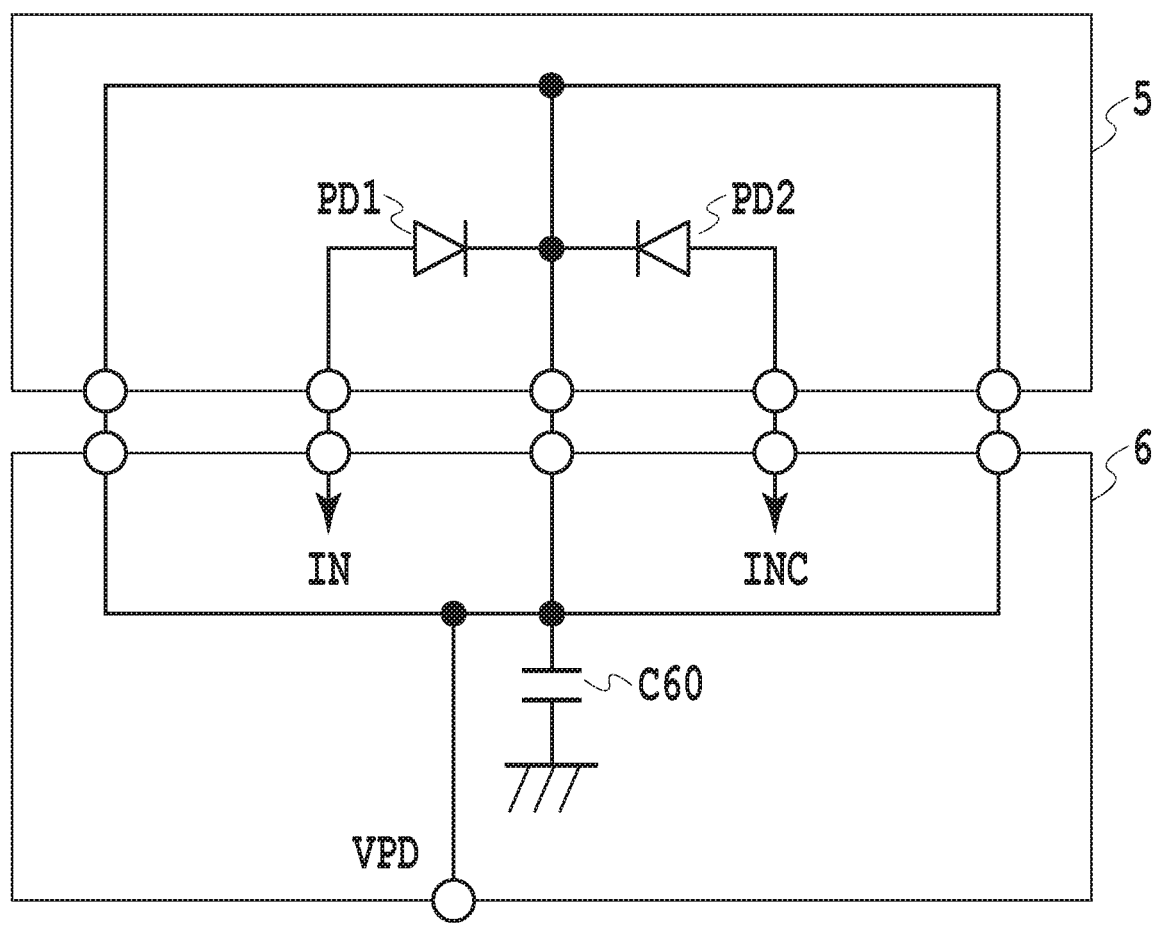
FIG. 9 is one example of a circuit diagram of a PD-TIA connection part for one channel in an optical receiver according to a first embodiment of the present invention.

FIG. 9 is a circuit diagram representing a PD-TIA connection part for one channel in an optical receiver according to a first embodiment of the present invention. This diagram is a circuit diagram of the connection part (PD-TIA connection part) for one channel, which corresponds one of four channels between a dual photodiode (PD) chip 5 and a transimpedance amplifier (TIA) chip 6 in the conventional digital coherent optical transceiver shown in FIG. 2.

FIG. 9 shows the PD-TIA connection part connecting the PD chip 5 which mounts PDs (PD1, PD2) constituting the dual photodiode for one of a plurality of channels and the TIA chip 6 which mounts the transimpedance amplifier (TIA) for one of the same number of channels. In the present invention, signal lines (IN, INC) for each channel are each surrounded by a PD power source line (PD power source pattern) VPD through which PD power is supplied to the PD chip 5 from the TIA chip 6. In FIG. 9, the descriptions of symbols for the TIA amplifier itself are omitted.

In the first embodiment of FIG. 9, the two PDs (PD1, PD2) constituting the dual photodiode for one channel which are mounted on the PD chip 5 are connected with their cathodes facing each other, and a connecting point of the cathodes is drawn out from the PD chip 5 and is connected to the PD power source line (PD power source pattern) VPD on the TIA chip 6.

Further, from two anodes of the two PDs (PD1, PD2) constituting the dual photodiode, the signal lines IN and INC are drawn out and are inputted into the TIA chip 6.

Further, from the above-described cathode connecting point, the PD power source line is branched toward circumferential sides of the PD chip 5 so as to surround the two PDs. The thus branched two PD power source lines are drawn out from terminals at positions sandwiching the terminals of the signal lines IN and INC, and are connected to the PD power source line VPD on the TIA chip 6. In addition, this PD power source line VPD is grounded with a capacitor C60 on the TIA chip 6 for stabilization at high frequencies.

These PD power source lines are, as a form of implementing a circuit, typically provided on a substrate as a pattern of a thin metallic film having conductivity, and therefore, can be referred to as a power source pattern or a conductor pattern. Due to this conductor pattern, most of electromagnetic waves from the outside emitted from adjacent channels, the transmitter, and the like are shielded by ambient PD power source patterns VPDs and power source terminals without directly entering signal lines IN, INC and signal terminals from the photodiode.

Due to this configuration, amount of electromagnetic waves received by the optical receiver, which was generated from adjacent channels within the optical receiver and from the optical transmitter inside the optical transceiver, can be significantly reduced, thereby allowing improvement of sensitivity for the optical receiver.

Another Example of First Embodiment

Figure 10:
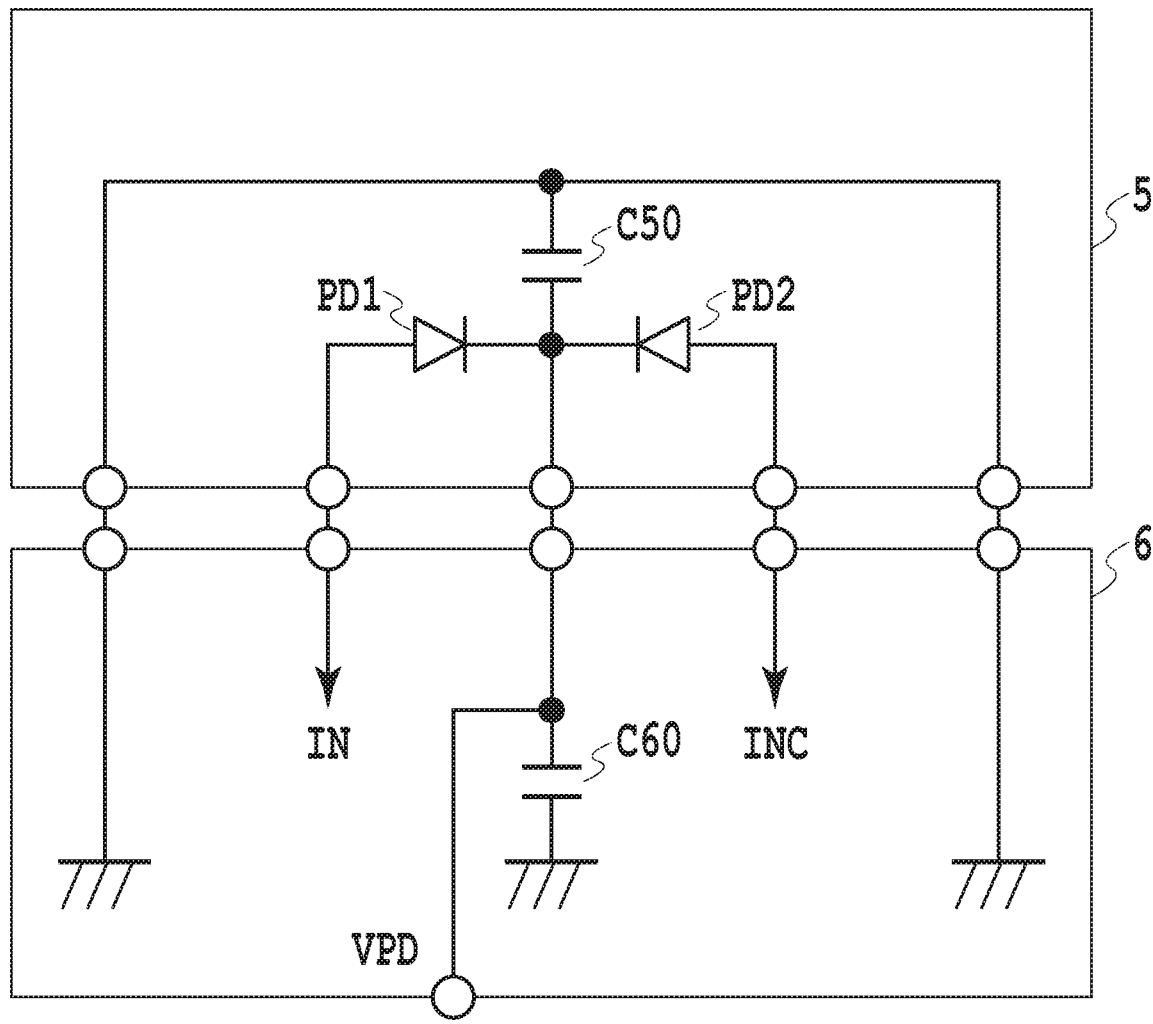
FIG. 10 is another example of a circuit diagram of the PD-TIA connection part of the optical receiver according to the first embodiment of the present invention.

FIG. 10 is another example of a circuit diagram of the PD-TIA connection part for one channel in the optical receiver according to the first embodiment of the present invention. This example is a circuit diagram in the case where the signal lines IN, INC from the PD chip 5 are surrounded by ground lines (ground pattern) instead of the PD power source line VPD, and the ground lines are connected to the ground pattern on the TIA chip 6.

As shown in FIG. 10, the two PDs (PD1, PD2) constituting the dual photodiode which are mounted on the PD chip 5 are connected with their cathodes facing each other, and a connecting point of the cathodes is drawn out from the PD chip 5 and is connected to the PD power source line VPD on the TIA chip 6.

Further, from two anodes of the two PDs (PD1, PD2) constituting the dual photodiode, the signal lines IN and INC are drawn out and are inputted into the TIA chip 6.

Further, from the above-described cathode connecting point, the conductor pattern is branched toward circumferential sides of the PD chip 5 via a capacitor C50 so as to surround the two PDs, and the branched lines are drawn out as two ground lines from terminals at positions sandwiching the terminals of the signal lines IN and INC and are connected to the ground lines on the TIA chip 6.

In addition, the PD power source line VPD is grounded with the capacitor C60 on the TIA chip 6 and with the capacitor C50 on the PD chip 5 for stabilization at high frequencies.

Similar to the PD power source lines, these ground lines are, as a form of implementing a circuit, typically provided on a substrate as a pattern of a thin metallic film having conductivity, and therefore, can be referred to as a ground pattern or a conductor pattern. Due to this conductor pattern, most of electromagnetic waves from the outside emitted from adjacent channels, the transmitter, and the like are shielded by ambient ground patterns without directly entering signal terminals such as signal lines IN, INC from the photodiode.

Second Embodiment of the Present Invention

Figure 11:
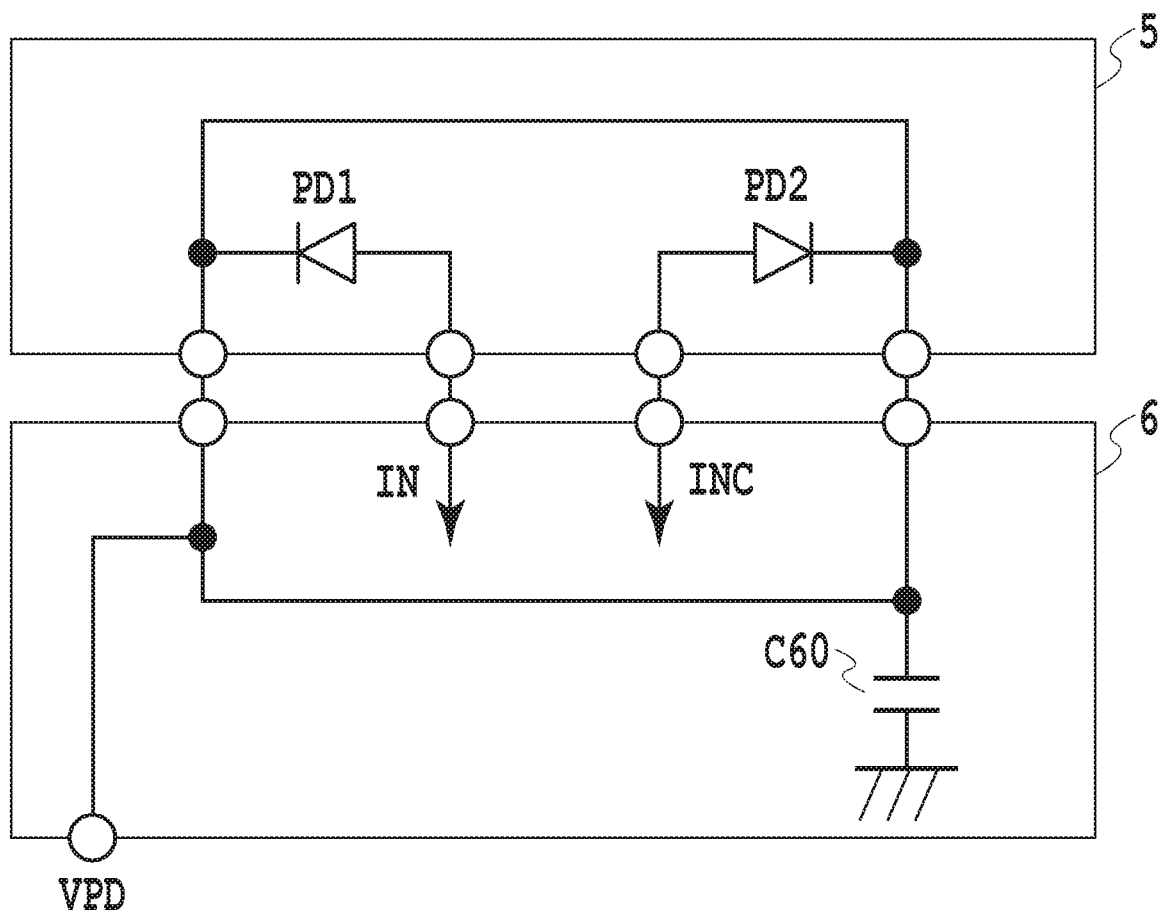
FIG. 11 is one example of a circuit diagram of a PD-TIA connection part of an optical receiver according to a second embodiment of the present invention.

FIG. 11 is a circuit diagram of a PD-TIA connection part for one channel in an optical receiver according to a second embodiment of the present invention.

In this second embodiment, as a circuit configuration, instead of providing terminals of the PD power source lines between the two terminals of the two signal lines IN, INC from the photodiode, the PD power source line VPD is located on the outer side of the PD chip 5, and is surrounding the photodiode and the two signal lines IN, INC.

In the second embodiment of FIG. 11, the two PDs (PD1, PD2) constituting the dual photodiode mounted on the PD chip 5 are arranged with their anodes facing each other, and the signal lines IN and INC are drawn out from both the anodes and are inputted into the TIA chip 6.

The conductor pattern is connected to the cathodes of the two PDs on the circumferential sides of the PD chip 5, which are branched on the respective circumferential sides, are drawn out from terminals at positions sandwiching the terminals of the signal lines IN and INC, and are connected to the PD power source line VPD on the TIA chip 6.

In addition, the PD power source line VPD is grounded with the capacitor C60 on the TIA chip 6 for stabilization at high frequencies.

Due to this configuration as well, most of electromagnetic waves from the outside emitted from adjacent channels, the transmitter, and the like are shielded by ambient PD power source lines VPDs without directly entering signal terminals such as the signal lines IN, INC from the photodiode.

Another Example of Second Embodiment

Figure 12:
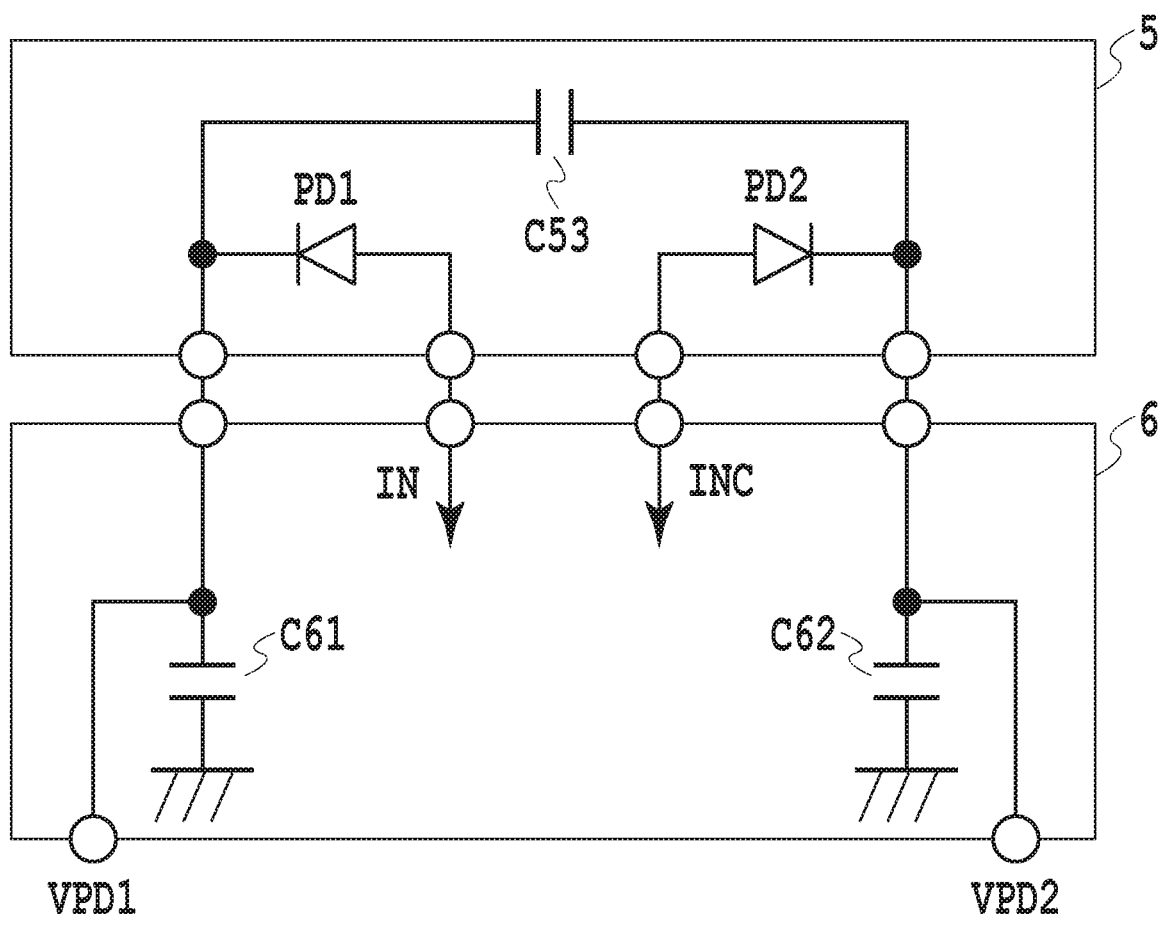
FIG. 12 is another example of a circuit diagram of the PD-TIA connection part of the optical receiver according to the second embodiment of the present invention.

FIG. 12 shows another example of a circuit diagram in the second embodiment of the present invention. In this example, two PD constituting the dual photodiode for each channel have independent power sources (VPD1, VPD2), and dual-system PD power source lines VPD1, VPD2 are located on the outer sides surrounding the photodiode (PD1, PD2) and the two signal lines IN, INC. Due to this configuration, photocurrent flowing through respective photodiodes can be independently monitored.

In this embodiment, a capacitor C53 which separates the cathodes of the two PDs (PD1, PD2) constituting the dual photodiode in a direct-current mode, and which connects the cathodes at high frequencies is provided.

As shown in FIG. 12, the two PDs (PD1, PD2) constituting the dual photodiode mounted on the PD chip 5 are arranged with their anodes facing each other, and the signal lines IN and INC are drawn out from both the anodes and are inputted into the TIA chip 6.

The conductor pattern is connected to the cathodes of the two PDs on circumferential sides of the PD chip 5 in an alternating-current mode via the capacitor C53. Further, from the cathodes of the two PDs, the conductor pattern is branched on respective circumferential sides, and the branched lines are drawn out from terminals on both sides at positions sandwiching the terminals of the signal lines IN and INC, and are connected to the PD power source lines VPD1, VPD2 on the TIA chip 6.

Further, these PD power source lines VPD1, VPD2 are respectively grounded with two capacitors C61, C62 on the TIA chip 6 for stabilization at high frequencies. The capacitor C53 on the PD chip 5 has an effect of stabilization when the balance between the right and left of the PD power source lines VPD1, VPD2 is lost.

Due to this configuration as well, most of electromagnetic waves from the outside emitted from adjacent channels, the transmitter, and the like are shielded by ambient PD power source lines VPD1, VPD2 without directly entering signal terminals such as the signal lines IN, INC from the photodiode.

The explanation has been given above on the basis of the example of a four-channel configuration, but the present invention is, of course, applicable even to a configuration of a plurality of channels other than four. Furthermore, it is evident that, even with a one-channel configuration, the effect of shielding against an electromagnetic wave generated from the transmitter within the optical transceiver is produced. Consequently, the present invention is also applicable to an optical receiver having a connection part (PD-TIA connection part) between a PD chip in which the dual photodiode for one or more channels are mounted and a TIA chip in which the transimpedance amplifier for the same number of channels are mounted.

In addition, in these embodiments, the examples of the optical receiver of a digital coherent optical communication system has been given, but the present invention is applicable not only to this system but also to any optical receivers as long as the dual photodiode and the transimpedance amplifier are employed. Further, in a transceiver into which a transmitter is integrated, the effect of the present invention becomes significant because the influence of crosstalk from the transmitter will be added to that from the adjacent channels.

INDUSTRIAL APPLICABILITY

As described above, according to the present invention, even in a case where high noise occurs inside the optical transceiver or the like in which an optical transmitter is built in the same enclosure with an optical receiver, it is possible to configure an optical transceiver that shields signal lines such that the optical receiver is as less susceptible to noise as possible.

REFERENCE SIGNS LIST 1 digital coherent optical transceiver
2 optical receiver
3 optical transmitter
4 dual polarization optical hybrid
5 dual photodiode (PD, PD chip)
6 transimpedance amplifier (TIA, TIA chip)
7 driver
8 optical modulator
PD1, PD2 photodiodes
C50 to C53, C60 to C62 capacitors
VPD, VPD1, VPD2 PD power source lines (PD power source pattern)
IN, INC signal lines

The invention claimed is:
1. An optical receiver comprising:
a PD chip on which two photodiodes (PDs) constituting a dual photodiode are mounted for each channel; and
a TIA chip on which a transimpedance amplifier (TIA) corresponding to each channel is mounted, wherein
a signal line connecting the PD chip and the TIA chip is surrounded by a conductor pattern that is not connected to the signal line for each channel, the conductor pattern being connected to a ground pattern on the TIA chip or a power source pattern for the PDs, wherein:
the two PDs constituting the dual photodiode are connected with their cathodes facing each other, a connecting point of the cathodes being connected to a PD power source pattern on the TIA chip;
from two anodes of the two PDs, two signal lines are drawn out and are inputted into the TIA chip;
from the cathode connecting point, the conductor pattern is branched so as to surround the two PDs toward circumferential sides of the PD chip, and the branched patterns are drawn out as two PD power source patterns from positions sandwiching the two signal lines and are connected to the PD power source pattern on the TIA chip; and
the PD power source pattern on the TIA chip is grounded at a high frequency with a capacitor on the TIA chip.

2. An optical receiver comprising:
a PD chip on which two photodiodes (PDs) constituting a dual photodiode are mounted for each channel; and
a TIA chip on which a transimpedance amplifier (TIA) corresponding to each channel is mounted, wherein
a signal line connecting the PD chip and the TIA chip is surrounded by a conductor pattern that is not connected to the signal line for each channel, the conductor pattern being connected to a ground pattern on the TIA chip or a power source pattern for the PDs,
wherein:
the two PDs constituting the dual photodiode are connected with their cathodes facing each other, a connecting point of the cathodes being connected to a PD power source pattern on the TIA chip;
from two anodes of the two PDs, two signal lines are drawn out and are inputted into the TIA chip;
from the cathode connecting point, the conductor pattern is branched so as to surround the two PDs toward circumferential sides of the PD chip via a capacitor, and the branched patterns are drawn out as two ground patterns from positions sandwiching the two signal lines and are connected to ground patterns on the TIA chip; and
the PD power source pattern on the TIA chip is grounded at a high frequency with a capacitor on the TIA chip.

3. An optical receiver comprising:
a PD chip on which two photodiodes (PDs) constituting a dual photodiode are mounted for each channel; and
a TIA chip on which a transimpedance amplifier (TIA) corresponding to each channel is mounted, wherein
a signal line connecting the PD chip and the TIA chip is surrounded by a conductor pattern that is not connected to the signal line for each channel, the conductor pattern being connected to a ground pattern on the TIA chip or a power source pattern for the PDs, and wherein:
the two PDs constituting the dual photodiode are arranged with their anodes facing each other, and two signal lines are drawn out from both the anodes and are inputted into the TIA chip;
the conductor pattern is connected to cathodes of the two PDs on circumferential sides of the PD chip, which are branched on the respective circumferential sides, are drawn out from positions sandwiching the terminals of the two signal lines, and are connected to the PD power source pattern on the TIA chip; and
the PD power source pattern on the TIA chip is grounded at a hi h frequency with a capacitor on the TIA chip.

4. An optical receiver comprising:
a PD chip on which two photodiodes (PDs) constituting a dual photodiode are mounted for each channel; and
a TIA chip on which a transimpedance amplifier (TIA) corresponding to each channel is mounted, wherein
a signal line connecting the PD chip and the TIA chip is surrounded by a conductor pattern that is not connected to the signal line for each channel, the conductor pattern being connected to a ground pattern on the TIA chip or a power source pattern for the PDs, wherein
the conductor pattern includes two independent conductor patterns that correspond to the respective two PDs for each channel, the conductor patterns being independently connected to the TIA chip and each being capacitively coupled to a ground pattern within the TIA chip, and wherein:
the two PDs constituting the dual photodiode are arranged with their anodes facing each other, and two signal lines are drawn out from both the anodes and are inputted into the TIA chip;
the conductor pattern is connected to cathodes of the two PDs on circumferential sides of the PD chip in an alternating-current mode via a capacitor, which are branched on the respective circumferential sides, are drawn out from positions sandwiching the two signal lines, and are respectively connected to two PD power source patterns on the TIA chip; and
the two PD power source patterns on the TIA chip are respectively grounded at high frequencies with two capacitors on the TIA chip.

* * * * *